United States Patent
Chung

(10) Patent No.: US 6,297,564 B1
(45) Date of Patent: *Oct. 2, 2001

(54) ELECTRONIC DEVICES EMPLOYING ADHESIVE INTERCONNECTIONS INCLUDING PLATED PARTICLES

(75) Inventor: Kevin Kwong-Tai Chung, Princeton Township, NJ (US)

(73) Assignee: Amerasia International Technology, Inc., Princeton Junction, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/276,259

(22) Filed: Mar. 25, 1999

Related U.S. Application Data

(60) Provisional application No. 60/083,326, filed on Apr. 28, 1998, provisional application No. 60/082,885, filed on Apr. 24, 1998, and provisional application No. 60/092,147, filed on Jul. 9, 1998.

(51) Int. Cl.$^7$ .................................................. H01L 29/40
(52) U.S. Cl. .......................................... 257/783; 438/118
(58) Field of Search ..................... 257/783, 787; 156/306.6; 438/118, 112, 124, 127

(56) References Cited

U.S. PATENT DOCUMENTS

| | | | |
|---|---|---|---|
| 2,014,524 | 7/1935 | Franz | 336/200 |
| 2,774,747 | 12/1956 | Wolfson et al. | 523/454 |
| 2,849,631 | 2/1958 | Matz . | |
| 3,401,126 | 9/1968 | Miller et al. | 252/514 |
| 3,429,040 | 2/1969 | Miller | 29/840 |
| 4,113,981 | 9/1978 | Fujita et al. | 174/88 R |

(List continued on next page.)

OTHER PUBLICATIONS

P. Scharf, T. Coleman and K. Avellar, "Flip Component Technology", IEEE Electronic Component Conference (1967), pp. 269–274.

Gilleo, K: "Direct Chip Interconnect Using Polymer Bonding", IEEE 39th Electronic Component Conference, May 1989, pp37–44.

(List continued on next page.)

*Primary Examiner*—Olik Chaudhuri
*Assistant Examiner*—Marcos D. Pizarro-Crespo
(74) *Attorney, Agent, or Firm*—Dann, Dorfman, Herrell and Skillman, P.C.

(57) ABSTRACT

Electronic devices formed by bonding and interconnecting one or more electronic components to an electronic circuit substrate employ specialized adhesives comprising gold-plated, platinum-plated and/or palladium-plated particles in a polymeric adhesive system which may include thermoplastic or thermosetting resins. These plated particles beneficially provide electrical conductivity through the polymeric adhesive for electrically interconnecting contact pads on the electronic components with contact pads on the electronic circuit substrate and provide resistance to migration of metal, thereby enabling interconnection and bonding at very fine pitch and spacing. Polymers with substantial flexibility and a low glass transition temperature are preferred over more rigid resins. Particles having a morphology and shapes that include higher aspect ratios are preferred because lesser volume fraction loading is needed to establish good electrical conductivity through the polymeric adhesive. A combination of high aspect ratio plated particles and spherical particles may be employed to enhance the thermal conductivity of the polymeric adhesive without substantially increasing the overall cost of the conductive polymer adhesive system. Electronic devices employing the invention include such applications as semiconductor die attachment, flip-chip device interconnection, electronic component attachment, electronic substrate attachment to printed wiring boards, jumper interconnection, and the like.

21 Claims, 2 Drawing Sheets

U.S. PATENT DOCUMENTS

| | | |
|---|---|---|
| 4,210,704 | 7/1980 | Chandross et al. . |
| 4,410,457 | 10/1983 | Fujimura et al. . |
| 4,442,966 | 4/1984 | Jourdain et al. ............... 228/122.1 |
| 4,695,404 | 9/1987 | Kwong . |
| 4,729,809 * | 3/1988 | Dery et al. ..................... 156/306.6 |
| 4,755,659 * | 7/1988 | Leon et al. ....................... 219/547 |
| 5,046,415 | 9/1991 | Oates ........................... 101/128.21 |
| 5,056,296 | 10/1991 | Ross et al. . |
| 5,074,947 * | 12/1991 | Estes et al. .................... 156/307.3 |
| 5,087,314 * | 2/1992 | Sandborn et al. ................. 156/330 |
| 5,183,594 * | 2/1993 | Yoshinaka et al. ............... 252/518 |
| 5,196,371 | 3/1993 | Kulesza et al. ................... 438/119 |
| 5,237,130 | 8/1993 | Kulesza et al. ................... 174/260 |
| 5,539,153 | 7/1996 | Schwiebert et al. ............. 174/260 |
| 5,611,140 | 3/1997 | Kulesza et al. . |
| 5,617,297 * | 4/1997 | Lo et al. ........................... 361/737 |
| 5,667,884 * | 9/1997 | Bolger ............................... 428/323 |
| 5,731,633 * | 3/1998 | Clayton ............................. 257/723 |
| 5,879,761 | 3/1999 | Kulesza et al. . |

OTHER PUBLICATIONS

R. Lachance, H. Lavoie, A Montanari, "Corrosion/Migration Study of Flip Chip Underfill and Ceramic Overcoating", IEEE Electronic Components and Technology conference (1997), pp. 885–889.

T.Y. Wu, Y. Tsukada, W.T. Chen, "Materials and Mechanics Issues in Flip–Chip Organic Packaging", IEEE Electronic Components and Technology Conference (1996), pp. 524–534.

B. Rösner, J. Liu, Z. Lai, "Flip Chip Bonding Using Isotopically Conductive Adhesives", Electronic Components and Technology Conference, (1996) pp. 578–581.

D. Gamota, C. Melton, "Advanced Encapsulant Materials Systems for Flip Chip", Advancing Microelectronics (Jul./Aug. 1997) pp. 22–24.

R.W. Johnson, D. Price, D. Maslyk, M. Palmer, S. Wentworth, C. Ellis, "Adhesive Based Flip Chip Technology for Assembly on Polyimide Flex Substrates", IEEE International Conference on Multichip Modules, 1997, pp. 81–86.

L. Schaper, K. Maner, S. Ang, "Reliability of Large Conductive Polymer Flip Chip Assemblies for Multichip Modules (MCMs)", IEEE International Conference on Multichip Modules (1997), pp. 87–91.

Dr. V. Ozguz, R. DeLosReyes, Dr. K. Chung, Dr. J. Licari, "Flexible Conductive Adhesive Bumps for Chip Scale Packaging", The Technical Conference At Chip Scale International, May 1998, pp. 15–19.

K. Chung, V. Ozguz, "Flexible Conductive Adhesive as Solder Replacement in Flip Chip Interconnection", Proceedings Semicon West 1998, Jul. 1998, pp. 1–14.

"Cost Effective Solutions for Advanced Semiconductor Interconnection and Packaging", AI Technology, Inc., Jul. 1998.

* cited by examiner

ELECTRONIC DEVICES EMPLOYING ADHESIVE INTERCONNECTIONS INCLUDING PLATED PARTICLES

This Application claims the benefit of U.S. Provisional Application Serial No. 60/083,326 filed Apr. 28, 1998, and of U.S. patent application Ser. No. 09/166,633 filed Oct. 5, 1998 which claims the benefit of U.S. Provisional Applications Serial Nos. 60/082,885 and 60/092,147 filed Apr. 24, 1998 and Jul. 9, 1998, respectively.

The present invention relates to electronic devices and, in particular, to electronic devices employing adhesive interconnections including plated particles.

Electrically conductive polymer adhesives have played a major role in electronic applications as conductive adhesives for forming electrical interconnections and as conductive inks for forming parts of electronic circuitry for more than 40 years. Most of the conductive adhesives used for such applications for microelectronics have been filled with silver particles or with silver-plated particles. While gold particles and silver-palladium-alloy particles have also been used, their use has been limited by their intrinsic high cost which is determined principally by the high cost of the precious metals employed therein, resulting in a cost differential of at least a factor of 20–50 times the cost of silver. Particles of other conductive materials, such as nickel, copper, and graphite, have been used in filled adhesives for certain specific applications, but are not suitable for electrically-conductive adhesives because of inherent conductivity limitations resulting from either the relatively higher electrical resistance of the nickel and graphite materials or the tendency of copper and nickel to form oxidation.

Silver and silver-plated particles are widely used because of their relative low cost and high electrical conductivity, for example, as shown in prior art U.S. Pat. Nos. 2,774,747, 2,849,631, 4,210,704, 4,410,457, and 4,695,404. One major drawback of silver-based conductors and particles arises from the fundamentally lower ionization energy of their outer-shell electrons which are easily ionized and thus migrate easily under the influence of an electrical field especially when facilitated by the presence of water and other sources of ions. Thus protection against this well-known silver-migration problem must be provided if interconnections or other electrical conductors are to be in close proximity to each other, as where interconnections are formed having a fine pitch (i.e. center-to-center spacing).

While gold and palladium particles overcome the silver migration problem, they have been much less used because of their high cost. Gold and palladium typically cost in the range of US$200–400 per troy ounce as compared to a cost of US$5–10 per troy ounce for silver. As the pitch of interconnections in both semiconductor-to-substrate level interconnections and the component-to-board level interconnections has become increasingly fine, avoidance of silver migration has increased the cost of the finished product. This is caused by the need for additional protective coatings or for protective dielectric underfill in the spaces between silver-based interconnections in order to achieve acceptable levels of resulting device reliability.

Although copper, nickel and aluminum are good electrical conductors in bulk form, they are poor conductors in the form of small particles because they oxidize relative easily. While plating with silver and other precious metals is a relatively well-established art, the adoption of such plating of precious metals other than silver onto particles of copper, nickel, aluminum and other metals for forming electrically-conductive adhesive interconnections has not been desirable or commercially practical because of the high intrinsic cost of the precious metals. The same is true for electroless plating of such precious metals other than silver over organic and inorganic particles, such as polymer spheres and powders, graphite, carbon particles and fibers, and glass powders or frits. Thus, silver and silver-plated particles were inexpensive and were commercially available, but precious-metal-plated particles were not.

Accordingly, there is a need for an electrically conductive adhesive that avoids the problem of silver migration at a cost that is substantially lower than that of the prior art gold, palladium and gold-palladium alloy particle systems.

To this end, an electronic device according to the present invention comprises a semiconductor chip having contact pads thereon, wherein the semiconductor chip is connected in a flip chip manner to a substrate having corresponding contact pads. Connections between corresponding contact pads on the semiconductor chip and on said substrate are made with a conductive adhesive including: an adhesive selected from the group consisting of thermosetting and thermoplastic polymer adhesives, and a multiplicity of core particles formed of a material other than a precious metal, wherein the core particles are plated with a precious metal selected from the group consisting of gold, platinum and palladium.

According to another aspect of the present invention, an electronic device comprises at least one electronic component having a plurality of contact pads on a first surface thereof and a substrate having a plurality of contact pads on a first surface thereof. The contact pads of the substrate are arranged in a pattern to correspond to the contact pads on the electronic component and the electronic component and the substrate are positioned with their respective first surfaces proximate each other. A plurality of conductive adhesive connections are between respective ones of the contact pads of the electronic component and of the corresponding contact pads of the substrate. The conductive adhesive includes an adhesive selected from the group consisting of thermosetting polymer adhesives, thermoplastic polymer adhesives, and combinations thereof. The conductive adhesive also includes a multiplicity of core particles formed of a material other than a precious metal that are plated with a precious metal selected from the group consisting of gold, platinum and palladium.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENTS

In general, the present invention relates to electronic devices wherein the interconnections between a substrate and electronic components mounted thereon, such as flip chip devices including semiconductor devices, resistors, capacitors and other components, a formed of a conductive adhesive that is filled with certain plated conductive particles. It is desirable that the adhesive also have a low modulus of elasticity so as to exhibit substantial compliance to accommodate differences between the coefficients of thermal expansion (CTE) of the electronic components and the substrate without the need of high modulus underfill to prevent fatigue and delamination failures or to reduce metal migration.

Figure 1:
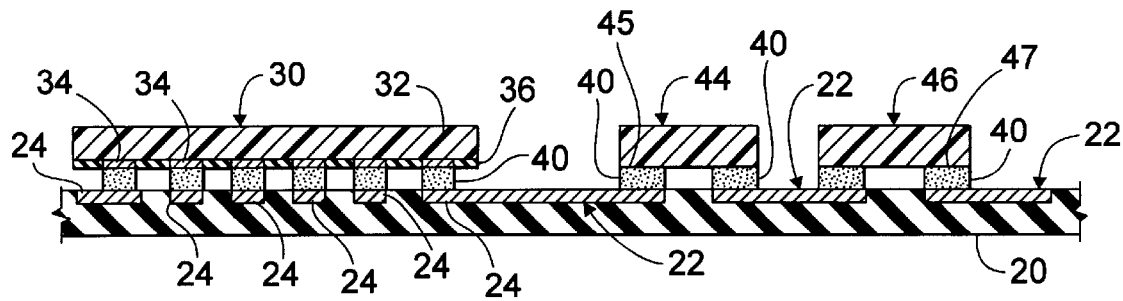
FIG. 1 is a cross-sectional schematic diagram of an exemplary electronic device according to one aspect of the present invention.

Electronic device 10 of FIG. 1 includes an insulating substrate 20 on which are aligned and mounted a plurality of electronic devices, such as semiconductor chip 30, chip resistor 44 and chip capacitor 46. There is no insulating underfill between the devices 30, 44, 46 and substrate 20. Semiconductor chip 30 includes on a first surface of substrate die 32 a plurality of contact pads 34 for making electrical connections between the electronic circuit contained in the semiconductor chip 30 and external electronic elements. Similarly, resistor 44 and capacitor 46 each include on a respective first surface a plurality of contact pads for making electrical connections between the resistive and capacitive circuit elements respectively contained in chip resistor 44 and in chip capacitor 46 and external electronic elements via substrate 20.

Substrate 20 includes on a first surface thereof printed wiring conductors 22 that form the conductors of an electronic circuit in conventional manner. A plurality of contact pads 24 are formed on the conductors 22 of substrate 20 at locations that correspond to the locations of corresponding bonding pads 34, 45, 47 of the electronic devices 30, 44, 46, respectively, to be mounted thereon. In other words, the arrangement, size and spacing of the contact pads 24 of substrate 20 match the arrangement, size and spacing of the contact pads 34 of semiconductor device 30. Substrate 20 may be fabricated of laminates such as FR-4 fiberglass or BT material, of coated aluminum, or of alumina, ceramic or other suitable insulating material and the conductors 22 thereon may be formed of metals, such as copper, aluminum, gold or silver, or by conductive inks formed by known technologies, such as by thin-film or thick-film deposition. If the contact pads thereon are not of a non-oxidizing material, such as a precious metal, then the contacts should be passivated with a precious metal coating or alloy for consistent long-term stability and integrity of electrical contact, as is also the case for the device attached to the substrate.

Electronic devices 30, 44, 46 are positioned with their respective first surfaces proximate the first surface of substrate 20 so that the respective contact pads of electronic devices 30, 44, 46 are adjacent the respective corresponding contact pads 24 on substrate 20, i.e. in a flip chip manner. Electronic devices 30, 44, 46 are attached to substrate 20 by a plurality of conductive adhesive bumps 40 that provide the mechanical attachment of the respective device 30, 44, 46 to substrate 20 as well as provide a low impedance electrical connection between each respective contact pad 34, 45, 47 and its counterpart correspondingly located on substrate 20, typically 0.1 ohm or less. Contact pads 34 comprise aluminum pads deposited on the semiconductor substrate 32 at the locations to which electrical contact is to be made for electrical function of the circuit (not shown) formed thereon, and are passivated by a deposited layer of a non-oxidizing metal, preferably a sequence of nickel and gold or other precious metal, such as gold, silver, platinum, palladium, or an alloy thereof. The contact pads 24 of substrate 20 are also passivated with a non-oxidizing metal. As is normal in semiconductor fabrication, but is not necessary, the thickness of the layer 36 of inorganic passivation is greater than the thickness of the contact pads 34.

It is desirable that conductive adhesive 40 be "flexible" by which is meant that it has a low modulus of elasticity. Conductive adhesives having a modulus of elasticity of less than about 500,000 psi as a filled composite, and preferably less than 300,000 psi, are preferred. The adhesive, which may include a thermoplastic or a thermosetting resin, or a blend or copolymer thereof, is rendered conductive by the inclusion therein of a multiplicity of small particles that are plated with a conductive precious metal, i.e. gold, platinum and/or palladium, which also increase its modulus of elasticity over that as a neat resin. Suitable flexible conductive adhesives include, for example, types ESS8457 (gold-plated copper filler) and ESS8459 (gold-plated nickel filler) flexible epoxy-based adhesive pastes and types PSS8157 (gold-plated copper filler) and PSS8159 (gold-plated nickel filler) flexible paste adhesives, all of which are commercially available from AI Technology, Inc. of Princeton, N.J. These flexible conductive adhesives have a modulus of elasticity of less than about 300,000 psi above their glass transition temperature. Types PSS8157 and PSS8159 flexible conductive adhesives include thermoplastic resins having a glass transition temperature below $-20°$ C. and having more than 30% elongation of dimension before fracture. Types ESS8457 and ESS8459 flexible conductive adhesives include modified thermosetting epoxy resins having a glass transition temperature below $0°$ C. and having more than 30% elongation of linear dimension before fracture.

In accordance with an aspect of the present invention, high electrical conductivity interconnections are formed by a polymeric adhesive filled with particles having a plating of gold, platinum and/or palladium on an inexpensive core particle. The core particle is one that in and of itself is not necessarily suited to form reliable high-conductivity electrical interconnections, although such connections may be made by employing the present invention. While the gold, platinum and/or palladium plating according to the present invention increases the basic material cost of the plated particle somewhat to approximately US$15 to $60 per troy ounce, the cost remains low enough to be acceptable, and certainly well below the cost of gold and palladium particles. Contributing to the lower cost are the shape and smaller size of the particles in conjunction with a lower ratio of particles to polymer adhesive in accordance with certain aspects of the invention.

Figure 2:
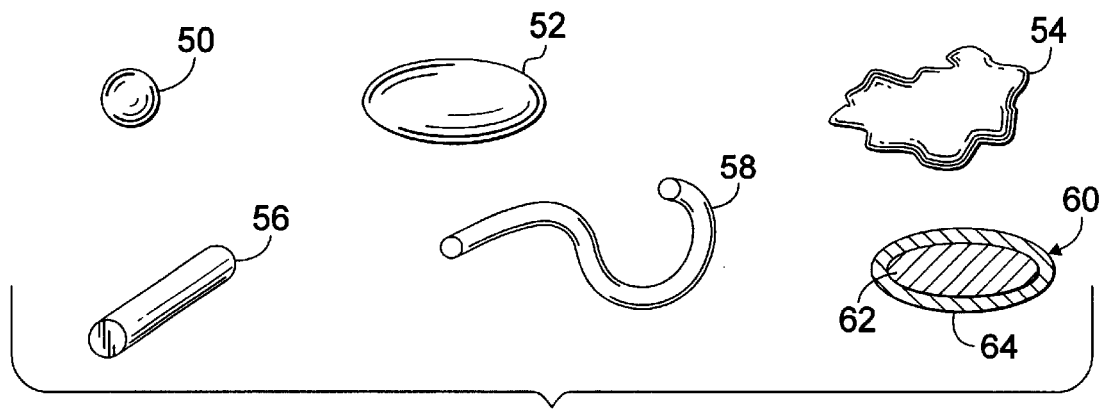
FIG. 2 is a diagram of a variety of particles useful in conjunction with the present invention.

FIG. 2 illustrates a variety of particle shapes that may be employed in accordance with the present invention. Core particles 62 and plated particles 60 have generally the same shape, with the plated particle 60 being slightly larger in size than the core particle 62 by the thickness of the gold, platinum and/or palladium plating 64. Spherical particles 50 have an aspect ratio of 1:1 and flake particles 52, 54 have aspect ratios ranging from about 2:1 to about 20:1 and may be relatively smooth shaped flakes 52 or irregularly-shaped flakes 54. Further, particles in the shape of rods 56 or fibers 58 may be employed, and each may have aspect ratios ranging from about 2:1 to about 20:1.

While plating gold and palladium to about 3%–5% of the core particle weight is generally adequate to provide adequate electrical conductivity for some electronic applications, the ease with which oxidation forms on the aluminum, copper, and nickel core particles makes them less useful, if not unsatisfactory, for more stringent and/or high reliability applications. According to the present invention, greater utility was found for such core particles when plated with more than about 5% by weight of gold, platinum and/or palladium. I.e. the weight of the gold, platinum and/or palladium plating is about 5% or more of the weight of the core particle. Increasing the plating by weight also increases the thickness of the plating and thereby substantially eliminates pin-holes in the plating on the surface of the conductive particles, thereby reducing if not eliminating oxidation of the core particles to improve the long-term stability of their conductivity, particularly the stability of conductivity at high temperature. For greater electrical conductivity and improved performance at high temperature, gold, platinum and/or palladium plating as heavy as 10%–30% by weight may be desirable, particularly where the material of the core particle is prone to oxidation. The plating of gold, platinum and/or palladium onto particulate may be accomplished by electroless plating, chemical bath plating, or other conventional plating technique.

Although a greater number of applications can be found for interconnections formed of a polymeric adhesive filled with gold-, platinum- and/or palladium-plated particles that have a metallic core particle, i.e. because the intrinsic conductivity of the metal core particle renders it able to carry more current for a given thickness of plating, all of the particles that can be plated with gold, platinum and/or palladium according to the present invention were found to be useful for some application. The preferred core particles are those commonly available and less susceptible to migration, such as copper, aluminum, and nickel particles. Silver particles and silverplated particles are not as desirable because of the problem of silver migration and silver leaching through pinholes.

The following terms are utilized in the descriptions below. The "aspect ratio" of a particle is the ratio of its length to its width. For example, a particle having an aspect ratio of 10:1 is more elongated than is a particle having an aspect ratio of 4:1; a spherical particle has an aspect ratio of 1:1. "Volume fraction loading" and volume percentage loading" are used interchangeably and refer to the amount of particulate filler in a filled adhesive, usually expressed as a percentage, but also expressable as a fraction. For example, a filled adhesive having a volume fraction loading of 33% includes 33% (i.e. ⅓) by volume filler material and 67% (i.e. ⅔) by volume adhesive material. "Polymer-to-flake ratio" is, unless specifically stated to be "by volume," is the ratio by weight of the amount of polymer adhesive to the amount of flake or filler material in a filled adhesive. For example, an adhesive having a polymer-to flake ratio of 1:5 includes filler material by weight that is five times the weight of the adhesive material, and so is ⅚ or about 84% by weight filler material.

A filled adhesive having a polymer-to-flake ratio by weight of 1:5, would have a polymer-to-flake ratio by volume of about 4:1 if filled with gold particles which are about 20 times as dense as is the polymeric adhesive, but would have a polymer-to-flake ratio by volume of about 8:1 if filled with gold-plated nickel particles which are only about 10 times as dense as is the polymeric adhesive. It is noted that in ratios, 2:1 is less than 3:1 and 1:5 is less than 1:2.

Figure 3:
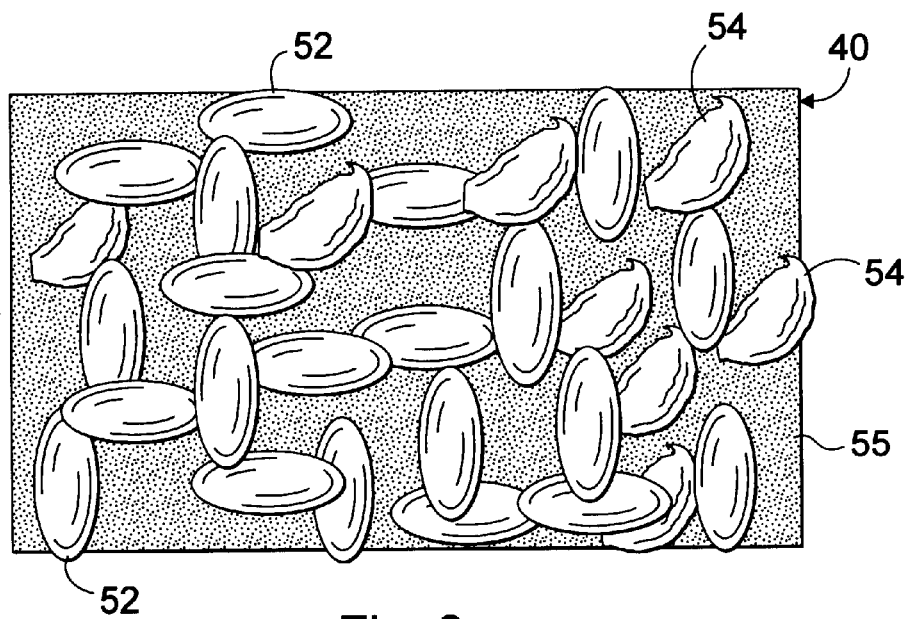
FIGS. 3 and 4 are microscopic cross-sectional views of respective portions of two exemplary conductive adhesives employed in the exemplary embodiment of FIG. 1.

In accordance with another aspect of the present invention, an example of which is shown in the microscopic cross-sectional diagram of FIG. 3, a large number of conductive particles 52, 54 in random orientation within a polymeric adhesive 55 contact adjacent like particles 52, 54 to form a network of conductive paths through the filled conductive adhesive 40. The aspect ratio of the particles 52, 54 may be selected to improve the resulting electrical conductivity of the conductive polymeric adhesive connection 40 while reducing the polymer-to-flake ratio. It is noted that the polymer-to-flake ratio of the filled conductive adhesive 40 must be less than a certain value, which is affected by the aspect ratio of the conductive particles 52, 54, in order for a sufficient number of the conductive particles 52, 54 to touch each other so as to form a network of conductive chains of conductive particles 52, 54 in all directions within the filled conductive adhesive 40 so as to enable the flow of electrical current therethrough. Typically, an adhesive filled with spherical conductive particles to a concentration of about 33% by volume will be electrically conductive, however, the volume percentage or volume fraction loading of conductive particles needed to render the filled adhesive conductive may be substantially reduced where the particles are high-aspect ratio conductive particles. One beneficial result of the selection of high-aspect ratio precious-metal-plated particles according to the present invention is to reduce both the amount of precious metal in each particle of the particulate as well as the volume fraction loading of particulate, thereby to further reduce the usage of gold, platinum and palladium, and therefore the cost of the filled electrically conductive polymeric adhesive system 40.

For example, plated conductive particles 52, 54, 56, 58, 60 having an aspect ratio of more than about 2:1 are suitable to provide such improved electrical conductivity at reduced volume percentages as compared to spherical particles. This phenomenon is quite well established and is reported in physics literature in relation to the physical theory of electrical percolation in achieving electrical conductivity. In the case of spherical conductive particles 50 (aspect ratio of 1:1), the adhesive must be filled with conductive particles 50 to a volume fraction loading approximately 33% by volume (polymer-to-flake ratio by volume of 2:1) in order to produce connections having suitably low electrical resistance. In terms of weight ratios, plated copper spherical particles (aspect ratio of 1:1) which are utilized to fill an adhesive to a polymer-to-flake ratio by weight of about 1:5 (i.e. about 84% conductive filler by weight) or higher is needed to produce connections having nominal electrical conductivity, e.g., about 0.01 ohm. On the other hand, a plated copper flake 52, 54, 60 having an aspect ratio of about 5:1 may be able to render the conductively filled polymer 40 highly conductive with a polymer-to-flake ratio by weight as small as about 1:2. High aspect ratio particles, for example, in the form of flakes 52, 54, 60, rods 56 and fibers 58, typically require fewer particles by weight to render the polymer adhesive 55 sufficiently conductive. It is noted that nickel flakes having small particle sizes, such as 44 microns or less, for example, are more easily obtained and at lower cost, than are nickel fibers of like size and which have a higher aspect ratio.

While increasing the aspect ratio of the plated particles is beneficial to reduce the volume fraction loading of conductive particles (or to equivalently increase the polymer-to-flake ratio by weight) necessary to achieve a given level of electrical conductivity, such benefit is not without other effects. When the volume fraction loading of the conductive filled adhesive 40 is decreased by employing higher aspect ratio filler particles, the thermal conductivity of the conductive filled adhesive 40 is also decreased. While such decrease in thermal conductivity is of little concern in the many applications of adhesive connections where high thermal conductivity is not required, thermal conductivity is of concern in other applications and may become a concern where plated conductive particles having aspect ratios as high as 5:1 and even 30:1 are employed to reduce the volume fraction loading and polymer-to-flake ratio by weight of the conductive adhesive to very low values.

In applications where the reduced thermal conductivity exhibited by conductive adhesives filled with high aspect ratio particles need be improved, the thermal conductivity is increased by the addition of lightly-plated (e.g., plating of less than about 5% by weight of the particle weight) metallic spheres 70 to the filled conductive adhesive 40'. Such light plating is sometimes referred to as passivation.

Figure 4:
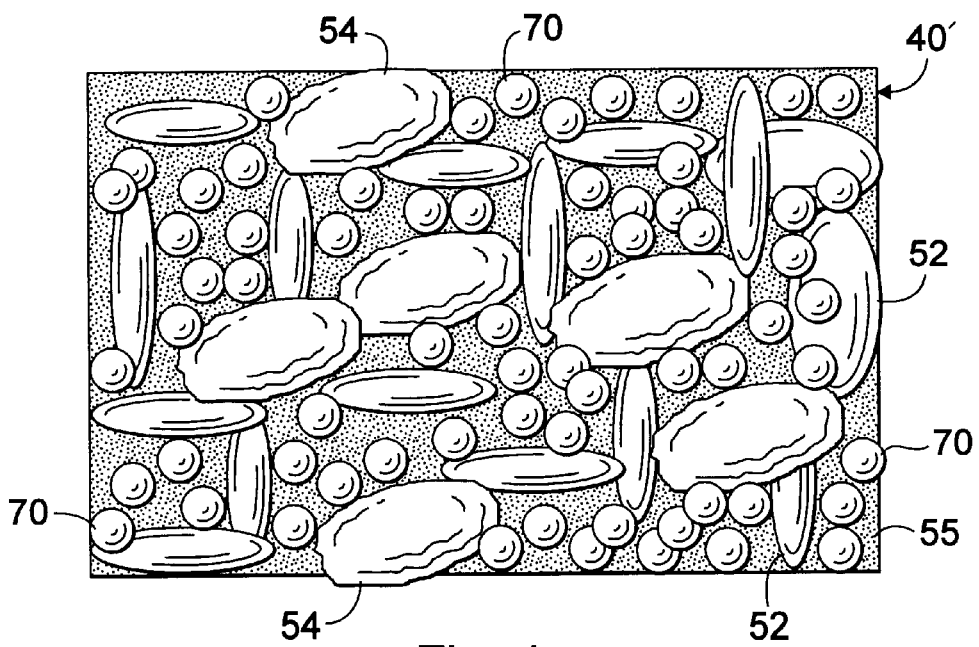

In accordance with this aspect of the present invention, an example of which is shown in the microscopic cross-sectional diagram of FIG. 4, a large number of plated high-aspect ratio conductive particles 52, 54 in random orientation within a polymeric adhesive 55 contact adjacent like particles 52, 54 to form a network of conductive paths through the filled conductive adhesive 40', and a larger number of metallic spheres 70 are in the spaces therebetween.

For example, a polymeric adhesive 55 filled with gold-plated particles in the form of flakes 52, 54 having and aspect ratio of 10:1 needs a polymer-to-flake ratio by weight of about 1:2 in order to achieve nominal electrical conductivity. While maintaining the same polymer-to-flake ratio, other particles 70 having a higher thermal conductivity may be added to the filled conductive adhesive 40' to enhance its thermal conductivity without adverse effect on its electrical conductivity. For this example, copper or aluminum spherical particles 70 having a diameter that is substantially smaller than the larger dimension of the plated flakes 52, 54, and which are lightly-plated to prevent surface oxidation, are added to the filled conductive adhesive 40' to improve its thermal conductivity without substantial detriment to its overall electrical conductivity. The number of spherical conductive particles 70 that may be added to enhance the thermal conductivity of the filled conductive adhesive 40' may be as many as three times the number of high aspect ratio particles 52, 54 therein.

EXAMPLE 1

Copper particles in the shape of flakes having a diameter of approximately 10 microns and an aspect ratio of approximately 10:1, part number RD CU Flake 7 commercially available from Degussa Corporation located in Plainfield, N.J., are gold plated with approximately 10% by weight of gold for electrical conductivity. The gold-plated copper flakes are the conductive particle filler employed in type ME8659 thermosetting polymer epoxy paste adhesive available from AI Technology, Inc. located in Princeton, N.J., to form a filled conductive adhesive that can be screened, stenciled, dispensed, or otherwise deposited by conventional methods. To fabricate an electronic device, bumps of the filled conductive adhesive are deposited onto the contact pads of a substrate, such as a printed wiring circuit board fabricated of FR-4 material. Electrical components, either of a leaded type or of a leadless type having contact pads, are placed onto the printed wiring circuit board with the bumps of filled conductive adhesive forming interconnections between contact pads on the printed wiring circuit board and the electronic components, in place of conventional solder connections. The adhesive is cured in a conventional belt-oven, for example, at a temperature of at least about 150° C., the curing is complete within about five minutes. The bulk electrical volume resistivity of this type ME8659 adhesive filled to a volume fraction loading of about 20% with the gold-plated 10% by weight 10:1 aspect ratio 10 micron diameter copper flakes is less than 0.005 ohm-cm, and the contact resistance of a connection formed thereby is less than 0.02 ohm for contact pads as small as a 100 micron square. The contact pads, contacts and leads of both the printed wiring circuit board and of the electrical components are passivated with a thin flash of gold or other non-migrating precious metal prior to connection.

EXAMPLE 2

The same type ME8659 adhesive with gold-plated copper flakes as in Example 1 is deposited on the same FR-4 printed wiring circuit board for attaching both fine-pitch electronic components and some flip-chip semiconductor devices thereto. The contacts on the flip-chip semiconductor devices have a close or fine pitch of 200 microns and are passivated with nickel-gold for oxidative protection. Pick-and-place equipment capable of placing the flip-chip semiconductor devices onto the FR-4 printed wiring circuit board with a positional error of 12 microns or less, such as a model 505 pick-and-place equipment made and sold commercially by MRSI located in Chelmsford, Mass., is one tool suitable for placing electronic components at such close-pitch, even for large circuit boards of up to about 18 inches on a side.

EXAMPLE 3

A ceramic circuit board substrate is employed in a typical hybrid electronic device including both active and passive electronic components and thick-film circuitry. Several flip-chip semiconductor devices are utilized in conjunction with surface mounted electronic components. The conductive adhesive is deposited onto the bonding pads, either by screening, stenciling, dispensing and other similar precision deposition method. The preferred adhesive is type ME8458 thermosetting epoxy adhesive also available from AI Technology, which includes gold-plated 10% by weight 10-micron 10:1 aspect ratio copper flakes, part number #7 commercially available from Degussa Corporation, mixed therein at a volume fraction of about 20% which has a high thixotropic index and green strength before curing so that the components that area attached by such adhesive will remain in place prior to and during curing without shifting out of alignment. After placement of electronic components on the ceramic substrate, the electronic device is cured at a temperature of about 150° C. for about 30 minutes in a convection oven.

EXAMPLE 4

A number of relatively large electronic components, such as microprocessor and/or memory chips, are to be attached to a FR-4 printed wiring circuit board. A flexible thermosetting polymer adhesive having a low modulus of elasticity is employed, such as type ESS8359, a B-stageable epoxy filled with gold-plated 10% by weight 20-micron nickel flakes, part number 287 flakes commercially available from Novamet located in Wyckoff, N.J., to a volume fraction loading of about 20%, which is available from AI Technology. Type ESS8359 is high in viscosity and thixotropic index, and is best deposited by screening, stenciling, and other suitable printing methods onto the contact pads of the circuit board. Type ESS8359 adhesive includes solvent and so is B-staged and dried at a temperature of about 60–80° C. for approximately 30–60 minutes. Once the adhesive is dry, the FR4 printed wiring circuit board with the ESS8359 conductive adhesive bumps deposited on the contact pads thereof may be stored at ambient conditions for over 12 months before attaching the flip-chip devices and other electronic components thereto. For the best results, after storage and before the placement of components, the board with ESS8359 conductive bumps thereon may be heated to approximately 80–100° C. to render the conductive adhesive bumps tacky so that they will hold the flip-chip devices and other electronic components in position when they are placed on the printed wiring circuit board, such as by precision pick-and-place equipment. It is noted that type ESS8359 adhesive has a low modulus of elasticity, in the range of about 30,000 psi, and a glass transition temperature of about –55° C., and so remains flexible over the majority of the specification and operational temperature range of the electronic components, thereby making it an ideal adhesive for large components and semiconductor chips that may be exposed to a wide range of temperatures. The printed wiring circuit board once populated with electronic components and semiconductor chips attached by conductive polymer adhesive connections to their respective contact pads may be cured at a higher temperature of about 150–250° C. without additional pressure and without being held in a fixture.

While the type ESS8359 adhesive employed in Example 4 is thermosetting and is filled with gold-plated nickel particles, it is noted that gold-plated aluminum particles, gold-plated copper particles, palladium -plated aluminum particles, palladium -plated copper particles, and palladium -plated nickel particles may also be employed with similar cost effectiveness. It should be also noted that electronic components that are larger in size, and greater differences between the coefficients of thermal expansion of the electronic components and the substrate (e.g., the printed wiring circuit board), may be accommodated by employing filled conductive adhesives having a lower modulus of elasticity, e.g., 300,000 psi or lower, or a lower glass transition temperature, e.g., 25° C. or lower, or both.

EXAMPLE 5

A thermoplastic based adhesive is employed to attach electronic components to a high glass transition board formed of type BT material. Adhesive type LTP8159 is a liquid thermoplastic adhesive filled with gold-plated 10% by weight 6-micron 10:1 aspect ratio copper particles, part number #7 copper flake commercially also available from Degussa Corporation to a volume fraction loading of about 20% that is also available from AI Technology and has a high viscosity and high thixotropic index. The ester alcohol solvent used to dissolve the thermoplastic polymer has a low vapor pressure and a high boiling point, and the adhesive paste is suitable for deposition by screening, stenciling, and other suitable printing method. Bumps of the filled conductive adhesive paste are deposited onto the contact pads of the high glass transition BT-material circuit board and are first dried at about 60–80° C. for about 30–60 minutes. If the pitch of the interconnections is sufficiently great, the polymer adhesive bumps may be made slightly larger in size than the individual contact pads, to provide added adhesion. The volume of the dried bumps of conductive adhesive is typically about 60% of that of the original wet paste deposited, however, because the adhesive has a high molecular weight, the lateral dimension of the conductive adhesive bumps can be maintained at approximately 98% accuracy if properly stenciled, screened, or masked. Once the conductive adhesive bumps are dried, the circuit board with the conductive adhesive bumps thereon can be stored at ambient conditions for over 12 months without any deleterious effect. When final assembly is to be performed, the substrate circuit board is preheated to approximately 190–250° C. in order to render the adhesive bumps molten for suitable attachment of semiconductor chips and other electronic components thereto. The components to be attached to the substrate circuit board may be preheated to improve the wetting of the conductive adhesive to the contact pads thereof. Because attachment of components to the circuit board is performed at a relatively high temperature, the processing time should be minimized.

It should again be realized that other gold-, platinum- and/or palladium-plated particles may be substituted for the particular particle of the example with similar results. It should also be recognized that thermoplastic adhesives having different melting temperatures may be employed. For example, type LTP8099 thermoplastic adhesive available from AI Technology having a lower melt-flow temperature of about 120° C. is particularly useful for use with lower temperature circuit board materials, such as flexible circuits formed of polyester or polyimide substrates.

Examples 1–5 employ flexible adhesives so that internal thermally-induced stresses caused by differences in the coefficients of thermal expansion between the electronic components and the circuit substrate material are minimized and no underfill is needed to reduced the thermally-induced strain and shear stress. Because of the low migration characteristics of the plated conductive particles employed in Examples 1–5, dielectric adhesive underfill is also not required to inhibit metal migration. As a result, the applications of Examples 1–5 are cost effective even when the filled conductive adhesives employed therein are more expensive than the counterpart adhesives made with silver based products which require additional coatings and/or underfill to reduce silver migration.

EXAMPLE 6

A rigid epoxy-based thermosetting adhesive type ME8339, also available from AI Technology, which includes gold plated 10% by weight 10:1 aspect ratio 6-micron copper flake fillers, part number #7 commercially available from Degussa Corporation. This adhesive has a glass transition temperature of about 80° C. as a neat resin and has a low viscosity making it particularly suitable for application by the dispensing of dots and lines of adhesive, for example, for bonding silicon semiconductor dies and other electronic components in close proximity to each other. It is noted that traditional wire-bonded dies are bonded with the ME8339 adhesive along with flip-chips, leadless packages, and other packaged dies. The adhesive is cured at temperatures in the range from 80–180° C., with higher temperature curing being utilized when faster production is required.

Suitable copper flakes and other copper particles are available from Degussa Corporation located in Plainfield, N.J., suitable aluminum flakes and other aluminum particles are available from Eckart America located in Louisville, Ky., and suitable nickel flakes and other nickel particles are available from Novamet located in Wyckoff, N.J. Plating of such particles with gold, platinum and/or palladium is available from Ostolski Laboratories located in Newark, N.J. and Chemet Corporation located in Attleboro, Mass.

While the present invention has been described in terms of the foregoing exemplary embodiments, variations within the scope and spirit of the present invention as defined by the claims following will be apparent to those skilled in the art. For example, while adhesives that have molecular structures that are substantially flexible, as indicated by their lower glass transition temperatures, lower modulus of elasticity, and higher elongation before fracture, any suitable thermosetting or thermoplastic polymer adhesive system such as epoxy, silicone, acrylic, and polyurethane, polyester, thermoplastic elastomers, and the like may be employed. It is noted that polymers having molecular structures that are resistant to exposure to heat and moisture exposure without losing molecular stability and interfacial integrity tend to perform more satisfactorily in electronic devices.

In addition to the plating of gold, platinum and/or palladium on particles of copper, aluminum and nickel as described above, the present invention includes adhesives filled with conductive particles including a plating of such precious metals over organic and inorganic particles, such as polymer spheres and powders, graphite, carbon particles and fibers, and glass powders or frits.

Electronic devices employing the invention include such applications as semiconductor die attachment, flip-chip device interconnection, electronic component attachment, electronic substrate attachment to printed wiring boards, jumper interconnection, and the like.

What is claimed is:

1. An electronic device comprising:
    a substrate having contact pads thereon, wherein the contact pads are coated with an oxidation-resistant metal;
    a semiconductor chip having contact pads thereon coated with an oxidationresistant metal, wherein said semiconductor chip is connected in a flip chip manner to said substrate, wherein said substrate and said semiconductor chip have corresponding contact pads, wherein connections between corresponding contact pads on said semiconductor chip and on said substrate are made with a conductive adhesive including:
        an adhesive selected from the group consisting of thermosetting and thermoplastic polymer adhesives, a blend thereof and a copolymer thereof, wherein the polymer adhesive has a modulus of elasticity of less than 300,000 psi at temperatures above a glass transition temperature of 25° C. or lower and has more than 30% elongation of linear dimension before fracture, and
        a multiplicity of core particles formed of a material other than a precious metal selected from the group consisting of copper, aluminum, nickel, carbon, graphite, glass, and polymers, wherein said core particles are plated with a precious metal selected from the group consisting of gold, platinum and palladium, and wherein said plating with a precious metal is about 10% to about 30% by weight of the core particle weight.

2. The electronic device of claim 1 wherein said core particles include at least one of flakes, rods, and fibers.

3. The electronic device of claim 1 wherein said core particles have an aspect ratio of at least 2:1.

4. An electronic circuit assembly comprising:
    a plurality of electronic components including at least one semiconductor chip and at least one of a resistor and a capacitor, and each including contacts having an oxidation-resistant metal coating thereon, and
    a substrate having contact pads having an oxidation-resistant metal coating thereon to which contacts of said electronic components are mounted, wherein said electronic components including said semiconductor chip are connected in a flip chip manner to corresponding contact pads on said substrate, and wherein connections between corresponding contact pads of said electronic components and of said substrate include a conductive adhesive including:
        an adhesive selected from the group consisting of thermosetting and thermoplastic polymer adhesives, a blend thereof and a copolymer thereof, wherein the polymer adhesive has a modulus of elasticity of less than 300,000 psi at temperatures above a glass transition temperature of 25° C. or lower and has more than 30% elongation of linear dimension before fracture, and
        a multiplicity of core particles formed of a material other than a precious metal formed of a material selected from the group consisting of copper, aluminum, nickel, carbon, graphite, glass, and polymers, wherein said core particles are plated with a precious metal selected from the group consisting of gold, platinum and palladium, and wherein said plating with a precious metal is about 10% to about 30% by weight of the core particle weight.

5. The electronic circuit assembly of claim 4 wherein said core particles include at least one of flakes, rods, and fibers.

6. The electronic circuit assembly of claim 4 wherein said core particles have an aspect ratio of at least 2:1.

7. An electronic device comprising:
    at least one electronic component having a plurality of contact pads coated with an oxidation-resistant metal on a first surface thereof;
    a substrate having a plurality of contact pads coated with an oxidation-resistant metal on a first surface thereof, wherein said contact pads of said substrate are arranged in a pattern to correspond to the contact pads on said electronic component and wherein said electronic component and said substrate are positioned with their respective first surfaces proximate each other; and
    a plurality of conductive adhesive connections between respective ones of the contact pads of said electronic component and of the corresponding contact pads of said substrate, wherein said conductive adhesive includes:
        an adhesive selected from the group consisting of thermosetting polymer adhesives, thermoplastic polymer adhesives, and blends, copolymers and combinations thereof, wherein the polymer adhesive has a modulus of elasticity of less than 300,000 psi at temperatures above a glass transition temperature of 25° C. or lower and has more than 30% elongation of linear dimension before fracture, and
        a multiplicity of core particles formed of a material other than a precious metal selected from the group consisting of copper, aluminum, nickel, carbon, graphite, glass, and polymers, wherein said core particles are plated with a precious metal selected from the group consisting of gold, platinum and palladium, and wherein said plating with a precious metal is about 10% to about 30% by weight of the core particle weight.

8. The electronic device of claim 7 wherein said core particles include at least one of flakes, rods, and fibers.

9. The electronic device of claim 7 wherein said core particles have an aspect ratio of at least 2:1.

10. An electronic device comprising:
    a substrate having contact pads thereon;
    a semiconductor chip having contact pads thereon, wherein said semiconductor chip is connected in a flip chip manner to said substrate, wherein said substrate and said semiconductor chip have corresponding contact pads, wherein connections between corresponding contact pads on said semiconductor chip and on said substrate are made with a conductive adhesive including:
        an adhesive selected from the group consisting of thermosetting and thermoplastic polymer adhesives, a blend thereof and a copolymer thereof, wherein the polymer adhesive has a modulus of elasticity of less than 300,000 psi at temperatures above a glass transition temperature of 25° C. or lower and has more than 30% elongation of linear dimension before fracture, and a multiplicity of core particles formed of a material other than a precious metal, wherein said core particles are plated with a precious metal selected from the group consisting of gold, platinum and palladium, and wherein said plating with a precious metal is about 10% to about 30% by weight of the core particle weight.

11. The electronic device of claim 10 wherein said core particle is formed of a material selected from the group consisting of copper, aluminum, nickel, carbon, graphite, glass, and polymers.

12. The electronic device of claim 10 wherein said core particles include at least one of flakes, rods, and fibers.

13. The electronic device of claim 10 wherein said core particles have an aspect ratio of at least 2:1.

14. An electronic circuit assembly comprising:

a plurality of electronic components including at least one semiconductor chip and at least one of a resistor and a capacitor, and a substrate having contact pads to which contacts of said electronic components are mounted, wherein said electronic components including said semiconductor chip are connected in a flip chip manner to corresponding contact pads on said substrate, and wherein connections between corresponding contact pads of said electronic components and of said substrate include a conductive adhesive including:

an adhesive selected from the group consisting of thermosetting and thermoplastic polymer adhesives, a blend thereof and a copolymer thereof, wherein the polymer adhesive has a modulus of elasticity of less than 300,000 psi at temperatures above a glass transition temperature of 25° C. or lower and has more than 30% elongation of linear dimension before fracture, and a multiplicity of core particles formed of a material other than a precious metal, wherein said core particles are plated with a precious metal selected from the group consisting of gold, platinum and palladium, and wherein said plating with a precious metal is about 10% to about 30% by weight of the core particle weight.

15. The electronic circuit assembly of claim 14 wherein said core particle is formed of a material selected from the group consisting of copper, aluminum, nickel, carbon, graphite, glass, and polymers.

16. The electronic circuit assembly of claim 14 wherein said core particles include at least one of flakes, rods, and fibers.

17. The electronic circuit assembly of claim 14 wherein said core particles have an aspect ratio of at least 2:1.

18. An electronic device comprising:

at least one electronic component having a plurality of contact pads on a first surface thereof;

a substrate having a plurality of contact pads on a first surface thereof, wherein said contact pads of said substrate are arranged in a pattern to correspond to the contact pads on said electronic component and wherein said electronic component and said substrate are positioned with their respective first surfaces proximate each other; and a plurality of conductive adhesive connections between respective ones of the contact pads of said electronic component and of the corresponding contact pads of said substrate, wherein said conductive adhesive includes:

an adhesive selected from the group consisting of thermosetting polymer adhesives, thermoplastic polymer adhesives, and blends, copolymers and combinations thereof, wherein the polymer adhesive has a modulus of elasticity of less than 300,000 psi at temperatures above a glass transition temperature of 25° C. or lower and has more than 30% elongation of linear dimension before fracture, and a multiplicity of core particles formed of a material other than a precious metal, wherein said core particles are plated with a precious metal selected from the group consisting of gold, platinum and palladium, and wherein said plating with a precious metal is about 10% to about 30% by weight of the core particle weight.

19. The electronic device of claim 18 wherein said core particle is formed of a material selected from the group consisting of copper, aluminum, nickel, carbon, graphite, glass, and polymers.

20. The electronic device of claim 18 wherein said core particles include at least one of flakes, rods, and fibers.

21. The electronic device of claim 18 wherein said core particles have an aspect ratio of at least 2:1.

* * * * *